United States Patent
Clark et al.

(10) Patent No.: US 9,412,790 B1
(45) Date of Patent: Aug. 9, 2016

(54) SCALABLE RRAM DEVICE ARCHITECTURE FOR A NON-VOLATILE MEMORY DEVICE AND METHOD

(71) Applicant: Crossbar, Inc., Santa Clara, CA (US)

(72) Inventors: Mark Harold Clark, Santa Clara, CA (US); Natividad Vasquez, San Francisco, CA (US); Steven Maxwell, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/705,082

(22) Filed: Dec. 4, 2012

(51) Int. Cl.
| | |
|---|---|
| *H01L 21/332* | (2006.01) |
| *H01L 27/24* | (2006.01) |
| *H01L 45/00* | (2006.01) |

(52) U.S. Cl.
CPC ........ *H01L 27/2481* (2013.01); *H01L 45/1675* (2013.01)

(58) Field of Classification Search
CPC .. H01L 45/16; H01L 45/1675; H01L 27/2481
USPC ........... 438/133, 139, 382; 257/154; 365/100, 365/148
See application file for complete search history.

(56) References Cited

U.S. PATENT DOCUMENTS

| | | | |
|---|---|---|---|
| 680,652 A | 8/1901 | Elden | |
| 4,433,468 A | 2/1984 | Kawamata | |
| 4,684,972 A | 8/1987 | Owen et al. | |
| 4,741,601 A | 5/1988 | Saito | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |

(Continued)

FOREIGN PATENT DOCUMENTS

| | | | |
|---|---|---|---|
| JP | 2005-506703 A | 3/2005 | |
| JP | 2006-032951 A | 2/2006 | |

(Continued)

OTHER PUBLICATIONS

Notice of Allowance for U.S. Appl. No. 13/725,331, dated Jan. 17, 2014.

(Continued)

*Primary Examiner* — Kimberly Rizkallah
*Assistant Examiner* — Maria Ligai
(74) *Attorney, Agent, or Firm* — Amin, Turocy & Watson, LLP

(57) ABSTRACT

A method for forming a resistive switching device. The method includes providing a substrate having a surface region and forming a first dielectric material overlying the surface region. A first wiring structure is formed overlying the first dielectric material. The method forms one or more first structure comprising a junction material overlying the first wiring structure. A second structure comprising a stack of material is formed overlying the first structure. The second structure includes a resistive switching material, an active conductive material overlying the resistive switching material, and a second wiring material overlying the active conductive material. The second structure is configured such that the resistive switching material is free from a coincident vertical sidewall region with the junction material.

20 Claims, 8 Drawing Sheets

(56) References Cited

U.S. PATENT DOCUMENTS

| | | |
|---|---|---|
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,030,634 B2 * | 10/2011 | Lung et al. ................ 257/2 |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,265,136 B2 | 9/2012 | Hong et al. |
| 8,374,018 B2 | 2/2013 | Lu |
| 8,385,100 B2 | 2/2013 | Kau et al. |
| 8,394,670 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0202041 A1 * | 10/2004 | Hidenori ................ 365/233 |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0134837 A1 * | 6/2006 | Subramanian et al. ........ 438/131 |
| 2006/0246606 A1 * | 11/2006 | Hsu et al. ................ 438/3 |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |

(56) References Cited

U.S. PATENT DOCUMENTS

| | | |
|---|---|---|
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1* | 2/2010 | Kinoshita et al. ............ 257/2 |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0186797 A1* | 8/2011 | Herner ............... 257/2 |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0170359 A1* | 7/2012 | Wu et al. ............... 365/163 |
| 2012/0205606 A1 | 8/2012 | Lee et al. |
| 2012/0220100 A1 | 8/2012 | Herner |
| 2012/0235106 A1* | 9/2012 | Tang ............... H01L 21/76883 257/2 |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0134383 A1* | 5/2013 | Hwang et al. ............... 257/5 |

FOREIGN PATENT DOCUMENTS

| | | |
|---|---|---|
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.

(56) References Cited

OTHER PUBLICATIONS

Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
Andrédehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching In Amorphous Silicon Devices", Journal of Non-Crystalline Solids 59 & 60, 1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.

(56) References Cited

OTHER PUBLICATIONS

Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.

* cited by examiner

SCALABLE RRAM DEVICE ARCHITECTURE FOR A NON-VOLATILE MEMORY DEVICE AND METHOD

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention is directed to resistive switching device. More particularly, embodiments according to the present invention provide a device structure and a method to form a resistive switching device. The resistive switching device has been applied in non-volatile memory device. But it should be recognized that embodiment according to the present invention can have a much broader range of applicability.

In a specific embodiment, a method of forming a resistive switching device for a non-volatile memory device is provided. The method includes providing a substrate having a surface region and forming a first dielectric material overlying the surface region of the substrate. A first wiring structure is formed overlying the first dielectric material and a first junction material comprising a p+ polycrystalline silicon material is deposited overlying at least the first wiring structure. In a specific embodiment, the method forms a hardmask overlying the first junction material. The first junction material is subjected to a first patterning and etching process to form one or more first structure overlying a surface region of the first wiring structure using the hardmask as a masking layer. A second dielectric material is formed overlying the one or more first structures and filling a gap region between the one or more first structures. The method includes depositing a resistive switching material overlying the one or more first structures and a second surface region of the second dielectric material. In a specific embodiment, an active conductive material is formed overlying the resistive switching material. A second wiring material is formed overlying the active conductive material. The method subject a stack of material comprising the second wiring material, the active conductive material, and the resistive switching material to a second patterning process to form a second structure comprising the second wiring material, the active conductive material, and the resistive switching material in a specific embodiment. The first structure including the junction material and the second structure including at least the resistive switching material are configured such that the resistive switching material and the junction material do not share a common sidewall region to inhibit electrical connection between the first wiring structure and the second wiring structure.

In a specific embodiment, a device structure is provided. The device includes a substrate having a service region and a first dielectric material overlying the surface region. A first wiring structure overlies the first dielectric material. In a specific embodiment, the device structure includes a first structure comprising a junction material overlying the first wiring structure. The junction material is configured to be in physical and electrical contact with the first wiring structure. The first structure further includes a first vertical sidewall region. The device structure includes a second structure overlying at least the first structure. In a specific embodiment, the second structure includes a stack of material comprising a resistive switching material in physical and electrical contact with the junction material, an active metal material in physical and electrical contact with the resistive switching material, and a second wiring material in physical and electrical contact with the active metal material. The resistive switching material in the second structure includes a second vertical sidewall region free from a coincident region from the first vertical sidewall region in a specific embodiment.

Many benefits can be achieved by ways of present invention over conventional techniques. For example, the present method provides one or more device structures for forming a resistive switching device. These device structures are free from undesirable electrical connection between terminals for improved yield and enhanced device performance. The present device is characterized by low power consumption (operating voltage no greater than about 6 volts), high switching speed (in nanosecond range), and a high on-state current (Ion) to off-state current (Ioff) ratio (Ion to Ioff ratio greater than about $10^3$). These device properties are desirable for current and future demand for high density, high speed application in consumer electronics, and others. More than one device structures can be realized by ways of present invention for process flexibilities and device design flexibilities. Additionally, the present method uses conventional semiconductor processing techniques without modification to the equipments. Depending on the embodiment, one or more of these benefits may be realized.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1 is a simplified diagram illustrating a resistive switching device for a non-volatile memory device according to an embodiment of the present invention;

DETAILED DESCRIPTION OF THE PRESENT INVENTION

The present invention is generally related to resistive switching devices. More particularly, embodiments according to the present invention provide a device structure and a method to improve device performance of a resistive switching device The present invention can be applied to improving data retention characteristic of non-volatile memory devices, but it should be recognized that embodiments according to the present invention can have a much broader range of applicability Some embodiments of a resistive switching device include a two terminal device including a top electrode, a bottom electrode and a resistive switching material disposed between the top electrode and the bottom electrode. The resistive switching material is characterized by a resistance dependent on an electric field upon an application of a suitable voltage to one of the electrodes. The electric field causes a conductor path to form in the resistive switching material. Depending on the electrode material and the resistive switching material used, the conductor path can be formed from the electrode material or defect path in the presence of the electric field. The conductor path determines the resistance of the resistive switching material. For example, for a metal oxide material as the switching material, the conductor path can form from oxygen deficient sites in the metal oxide. For a silicon material as the switching material, the conductor path can be formed from the electrode material, which comprises an active metal material. The resistive switching material is in a high conductance state. The conductor path is broken or retracts when a reverse bias voltage is applied and causes the resistive switching material to be in a low conductance state. The resistance of the resistive switching material has a resistance depending on the voltage and provide for a multi-level or multi-bit device. Therefore the conductor path structure needs to be stable under selected voltage, forward bias voltage, or reverse bias voltage for proper data retention.

Embodiments according to the present invention provide a device structure and a method for a resistive switching device characterized by a stable conductive path when a pre-determined voltage is applied and a reliable data retention characteristic for the device.

Figure 1:
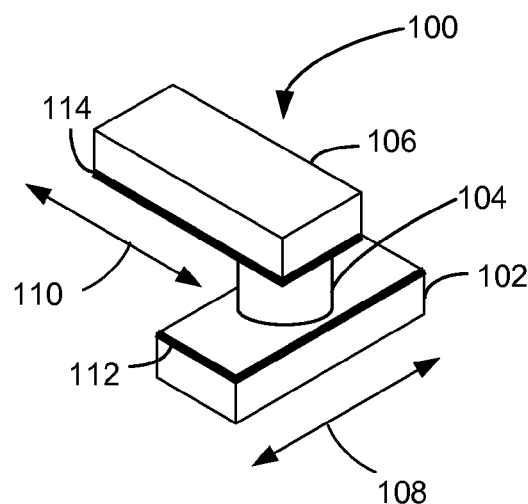
FIG. 1 is a simplified diagram illustrating a fabrication step according to various embodiments of the present invention.

FIG. 1 is a simplified diagram illustrating a resistive switching device 100 according to an embodiment of the present invention. The resistive switching device includes a first electrode 102, a second electrode 106, and a resistive switching material 104 sandwiched between the first electrode and the second electrode.

In various embodiments, resistive switching device 100 is formed upon a semiconductor substrate (not shown). In certain embodiments, the semiconductor substrate can have one or more MOS devices formed thereon. The one or more MOS devices can be controlling circuitry for the resistive memory devices in specific embodiments. In other embodiments, the one or more MOS devices may include other functionality, such as a processor, logic, or the like.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

In various embodiments, in FIG. 1, the first electrode 102 can be a first conductor material. The first electrode 102 can include a first conductive material such as a first metal material and/or a doped semiconductor material 112. In a specific embodiment, the first metal material 102 can be tungsten, aluminum, copper or other suitable metal that are compatible with CMOS fabrication techniques. In additional embodiments, a doped semiconductor material 112 may be p-doped polysilicon, p-doped silicon germanium, or the like. In some embodiments, doped semiconductor material 112 may include a lightly doped silicon containing lower layer that acts as a resistive layer, and a highly doped silicon containing upper layer that acts as a conductive layer. In one example, a p+ doped silicon germanium layer having a thickness of about 10-50 nm, e.g. 40 nm is on top of a p− doped silicon germanium layer having a thickness of about 50-100 nm, e.g. 50 nm. In a specific embodiment, the first electrode is elongated in shape and configured to extend in a first direction 108.

The resistive switching material 104 can include a suitable insulator material having a resistance that can be altered upon application of an electric field to the insulator material. In a specific embodiment, the resistive switching material 104 can include a silicon material. For example, the silicon material can be an amorphous silicon material, a microcrystalline silicon material, a macro crystalline silicon material, a silicon germanium material, a silicon oxide including any combination of these. In a various embodiments, the silicon material includes an amorphous silicon material and a silicon oxide material.

The resistive switching material 104 is characterized by a state, for example, a resistance state dependent on an electric field in the switching material. In a specific embodiment, the switching material is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 A per second (T=380° C., P=2.2 Ton) during PECVD. In another exemplary process, silane (SiH4 80 sccm) or disilane is used to form an a-Si layer with a deposition rate of 2.8 mn per minute (T=585° C., P=100 mTorr) during LPCVD. Portions of polysilicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped. A thin oxide may be formed above the amorphous silicon material, and be useful for switching purposes.

In yet another embodiment, the switching material 104, e.g. amorphous silicon material (and/or silicon oxide) 104 may be formed from an upper region of a p+ polycrystalline silicon or p+ silicon germanium bearing layer (e.g. 112) using an Argon, Silicon, Oxygen plasma etch, or the like. For instance, a plasma etch may use a bias power within a range of approximately 30 watts to approximately 120 watts to convert an upper region of the polysilicon or silicon germanium material into a non-conductive amorphous silicon having p-type impurities and/or a native silicon oxide (from the original polycrystalline silicon or silicon germanium bearing layer 112). In some embodiments, the silicon oxide may be SiOx, a sub-oxide. In some embodiments, switching layer may be on the order of 1 to 5 nm, e.g. 4 nm.

The second electrode 106 can be a second conductor material and can have a portion that includes a second metal material. The second metal material can be selected from aluminum, nickel, silver, gold, palladium, platinum, and others. The second metal material may have a suitable diffusivity in the switching material in a specific embodiment. In a specific embodiment, the second electrode is elongated in shape and configured to extend in a second direction 110 orthogonal to the first direction 108. In a specific embodiment, the second metal material includes a silver material.

As mentioned above, in certain embodiments, the resistive switching device 100 can include a contact material (112) disposed between the metal material of the first electrode 102 and the resistive switching layer 104. In some embodiments, the contact material 112 provides a suitable interfacial defect characteristic for desirable switching behavior for the switching device 100. For amorphous silicon material as the switching material 104, the contact material 112 can be p+ polysilicon or p+ silicon germanium material. In certain embodiments, the contact material 112 can be optional.

In various embodiments, additional interposing layer(s) 114 may be disposed between resistive switching material 104 and second electrode 106. The additional layer 114 may include a material that has non-noble metal properties, e.g. the material oxidizes in the presence of oxygen. In some examples, the additional layer 114 may be titanium, titanium nitride, tungsten, tungsten nitride, or the like. In various embodiments, additional layer 114 may serve as an adhesion and/or barrier layer between resistive switching material 104 and second electrode 106. In various embodiments, additional layer(s) 114 may be used to enhance retention, as will be described below. In some examples, the interposing layer is titanium/titanium oxide, and may be on the order of 1 to 5 nm, e.g. 2 nm.

In various embodiments, multiple resistive switching devices 100 can be disposed in an N by M crossbar array to form a high density interconnected array of non-volatile memory cells. A more detailed description of examples of a fabrication process are illustrated below.

Figure 2:
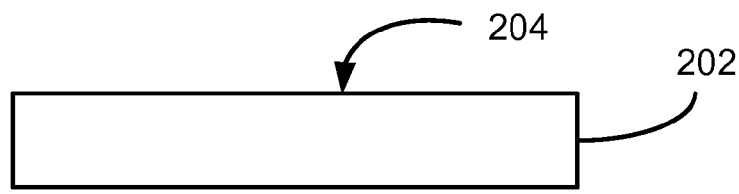
FIGS. 2-16 are simplified diagrams illustrating a method for forming a resistive switching device for a non-volatile memory device according to various embodiments of the present invention.

As shown in FIG. 2, a semiconductor substrate 202 having a surface region 204 is provided. Semiconductor substrate 202 can be a single crystal silicon wafer, a silicon germanium material, a silicon on insulator (commonly called SOI) depending on the embodiment. In certain embodiments, semiconductor substrate 202 can have one or more MOS devices formed thereon or therein. The one or more MOS devices can be controlling circuitry for the resistive switching device, or the like in some embodiments.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like. Additionally, in various embodiments, multiple layers of memory cells (e.g. first and second conductors, resistive switching layers, etc. as illustrated in FIG. 1) may be fabricated in various embodiments, greatly increasing memory density for such processors, devices, or the like.

Figure 3:
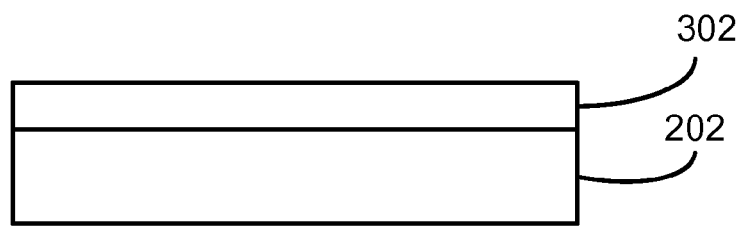

As illustrated in FIG. 3, embodiments of the method include depositing a first dielectric material 302 overlying the semiconductor substrate 202. First dielectric material 302 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 302 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 4:
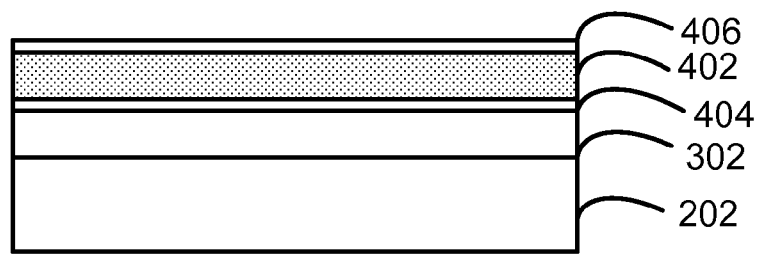

Referring to FIG. 4, embodiments of the method include depositing a first wiring material 402 overlying the first dielectric material. First wiring material 402 can be a suitable metal material including alloy materials, or a semiconductor material having a suitable conductivity characteristic. In some embodiments, the metal material can be tungsten, aluminum, copper or silver, and others. In some embodiments, the first wiring material may be a combination of conductive materials. In various embodiments, these metal materials may be deposited using a physical vapor deposition process, chemical vapor deposition process, electroplating, or electrodeless deposition process, a combinations of these, and others. In some embodiments, the semiconductor material can be, for example, a p-type doped silicon material, a conductive polysilicon, or the like.

In certain embodiments, a first adhesion material 404 is first formed overlying the first dielectric material 402 before deposition of the first wiring material 402 to promote adhesion of the first wiring material 402 to the first dielectric material 302. A diffusion barrier material 406 may also be formed overlying the first wiring material 402 to prevent, for example, the conductive material, the metal material, gasses, oxygen, or the like to contaminate other portions of the device in a specific embodiment.

Figure 5:
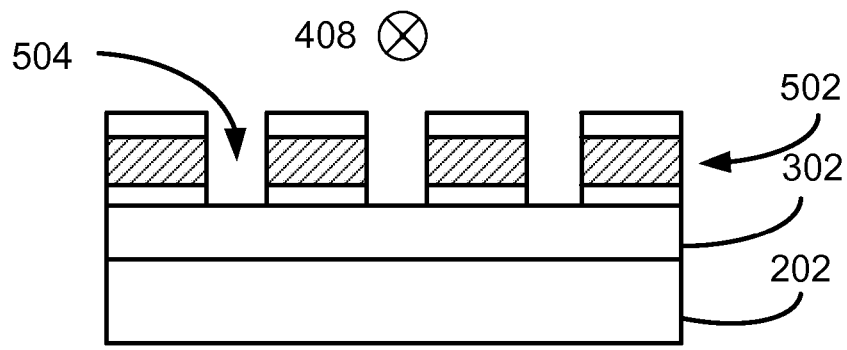

In FIG. 5, an embodiment of the method subjects the first wiring material (302, 404 and 406) to a first pattern and etching process to form a first wiring structure 502 in a specific embodiment, while exposing a portion 504 of first dielectric material 302. As shown in FIG. 5, the first wiring structure 502 includes a plurality of first elongated structures configured to extend in a first direction 408 (into and out of the page) in a specific embodiment.

Figure 6:
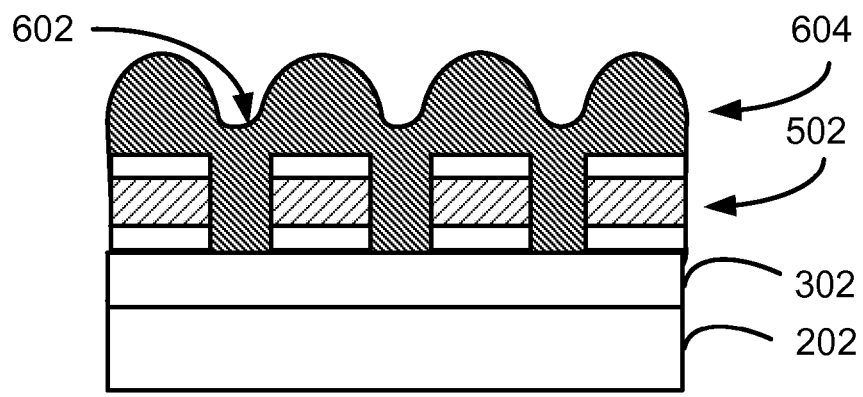

Referring to FIG. 6, a second dielectric material 602 is formed overlying the one or more first wiring structure and to fill a gap between the one or more first wiring structures 502 to isolate the one or more first wiring structures 502. Second dielectric material 602 further forms a thickness 604 overlying the first wiring structure 502 in a specific embodiment. Second dielectric material 602 can be silicon oxide, silicon nitride, silicon oxynitride, a high K dielectric, a low K dielectric, or a dielectric stack having alternating layer of silicon oxide and silicon nitride (for example an ONO stack), including any combination of these, and others. Second dielectric material 602 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

In some embodiments, prior to forming second dielectric material 602 a thin layer of material may be deposited to protect the side walls of first wiring structure 502 from contaminants, such as oxygen. In some embodiments, titanium, titanium nitride, silicon nitride, or the like may be used.

Figure 7:
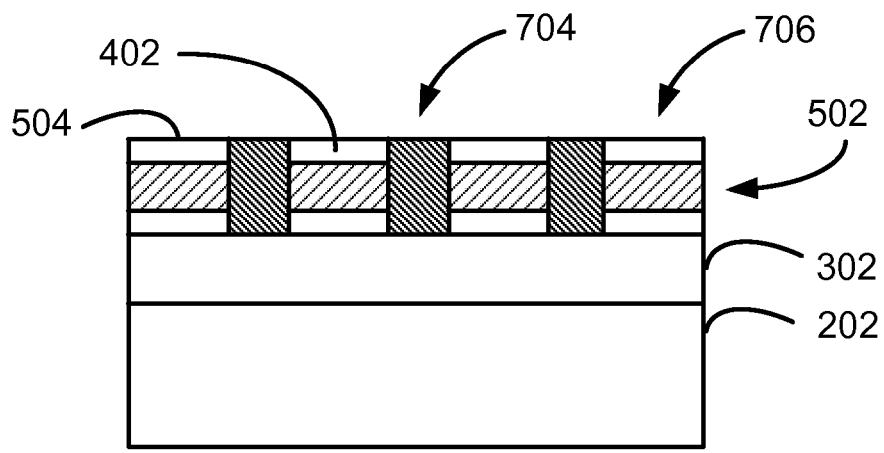

In various embodiments, the second dielectric material 604 is subjected to a planarizing process to form a planarized dielectric surface 704 and to expose a surface region 706 of the first wiring structure 502, as shown in FIG. 7. Planarizing process can be a chemical mechanical polishing (CMP) process, or an etch back process, or a combination depending on the embodiment.

Figure 8:
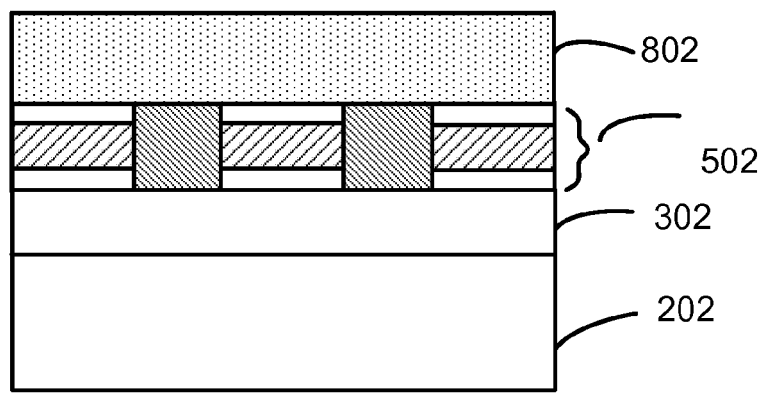

In a specific embodiment, a junction material 802 is deposited overlying the exposed surface region of the first wiring structure and the planarized surface of the second dielectric material, as illustrated in FIG. 8. Junction material 802 can be a p-doped silicon material. In a specific embodiment, the p-doped silicon material is a polysilicon having a p+ impurity characteristic. Depending on the application, the p+ impurity can be provided using boron, aluminum, gallium, indium, and other suitable p type impurity species. Again depending on the implementation, the polycrystalline silicon material may be deposited using techniques such as chemical vapor deposition including low pressure chemical vapor deposition, plasma enhanced chemical vapor deposition, atomic layer deposition, and others. Silicon precursors such as silane, a suitable chlorosilane in a presence of a reducing gas (for example, hydrogen) may be used. In other embodiments, the polycrystalline silicon material may be deposited using a physical vapor deposition technique from a suitable silicon target material. The p+ type impurity species can be co-deposited during deposition process (chemical vapor deposition or physical vapor deposition) or using an implantation process after deposition. Junction material 802 can be other suitable semiconductor material in a specific embodiment.

In various embodiments, the junction material 802 can be doped silicon germanium (poly-SiGe) material. In various embodiments, the silicon germanium material can be doped with a suitable impurity species to have a desirable conductivity, e.g. p+. The silicon germanium material can be deposited using a chemical vapor deposition process such as a low pressure chemical vapor deposition process, a plasma enhanced chemical vapor deposition process, atomic layer deposition (ALD) and others. Depending on the application, precursors such as silane and germane in a suitable carrier gas may be used. The silicon germanium material can have a p+ impurity characteristic provided by dopants such as boron, aluminum, gallium, indium, and others. Deposition temperature can range from about 400 Degree Celsius to about 490 Degree Celsius and the as deposited silicon germanium material is crystalline and has a desirable conductivity characteristic, without further anneal. Other deposition methods may also be used depending on the embodiment.

In various embodiments, as mentioned above, the junction material 802 may be composed of two or more layers of material. In one example, a highly doped layer of silicon bearing material may be disposed upon a lightly doped layer of silicon bearing material. These layers may be formed by increasing the dopant concentration during the formation of junction material 802. In some embodiments, an upper region may be a p+ silicon germanium layer, and a lower region may be a p− silicon germanium layer. It is believed that the upper region acts more like a conductor, and the lower region acts more like a resistive layer.

Depending on the application, a seed layer material may be formed overlying the first wiring material before deposition of the junction material. The seed layer material can include a thin layer of silicon material (about 40 Angstrom to about 120 Angstroms) deposited at temperatures no greater than about 430 Degree Celsius (for example, about 250 Degree Celsius to about 450 Degree Celsius) to promote crystallization of junction material 802.

Figure 9:
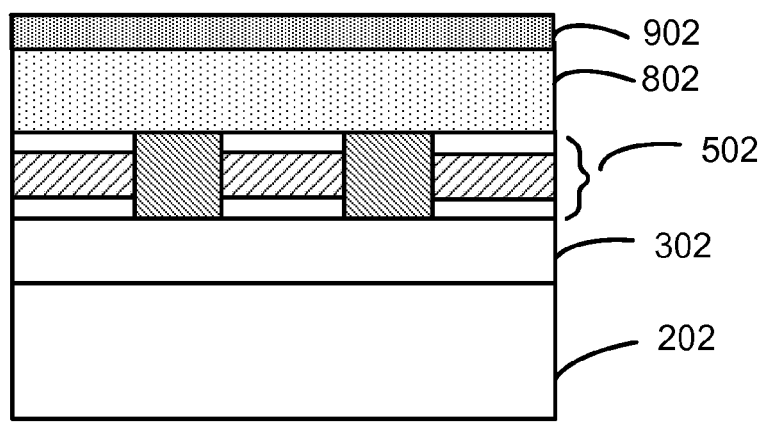
Figure 10:
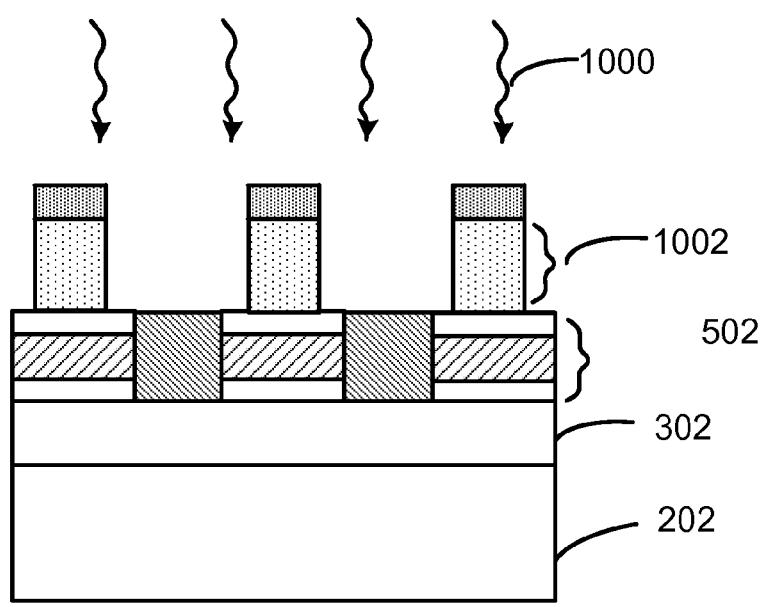

As shown in FIG. 9, a hardmask material 902 is deposited overlying the junction material 802. Hardmask material 902 can be a dielectric material, for example, silicon oxide, silicon nitride, silicon oxynitride, alternating layers of silicon oxide and silicon nitride (for example, ONO) and others. Hardmask material and the junction material are subjected to a pattern and etch process 1000 to form a plurality of first structures 1002 as illustrated in FIG. 10. In various embodiments, each of the plurality of first structures 1002 is configured overlying and in electrical and physical contact with the first wiring structure, as shown.

Figure 11:
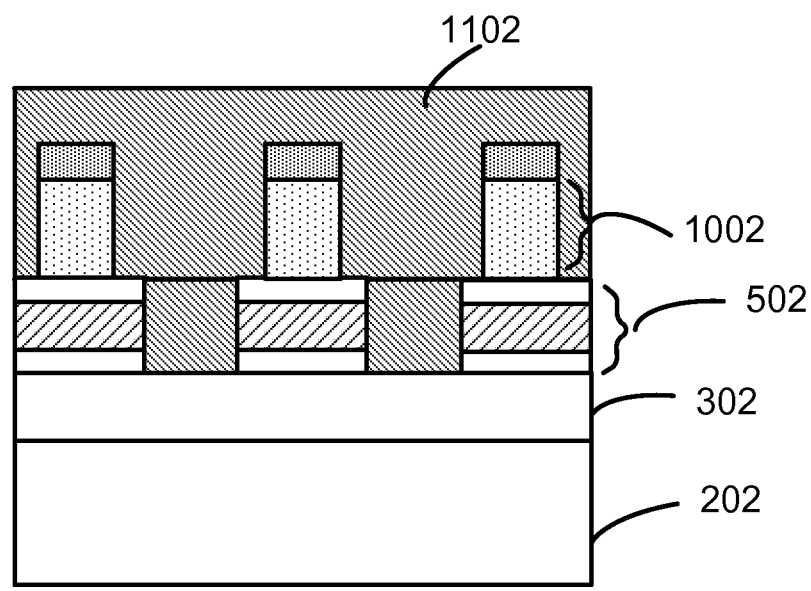

Referring now to FIG. 11, the method includes depositing a third dielectric material 1102 overlying the plurality of first structures 1002 and filling a gap between each of the plurality of first structures 1002. The third dielectric material may be silicon oxide, silicon nitride, silicon oxynitride, and others. In certain implementations, third dielectric material is silicon oxide deposited using techniques such as chemical vapor deposition process, including plasma enhanced chemical vapor deposition process, low pressure chemical vapor deposition process, sub atmospheric chemical vapor deposition process, and others.

Figure 12:
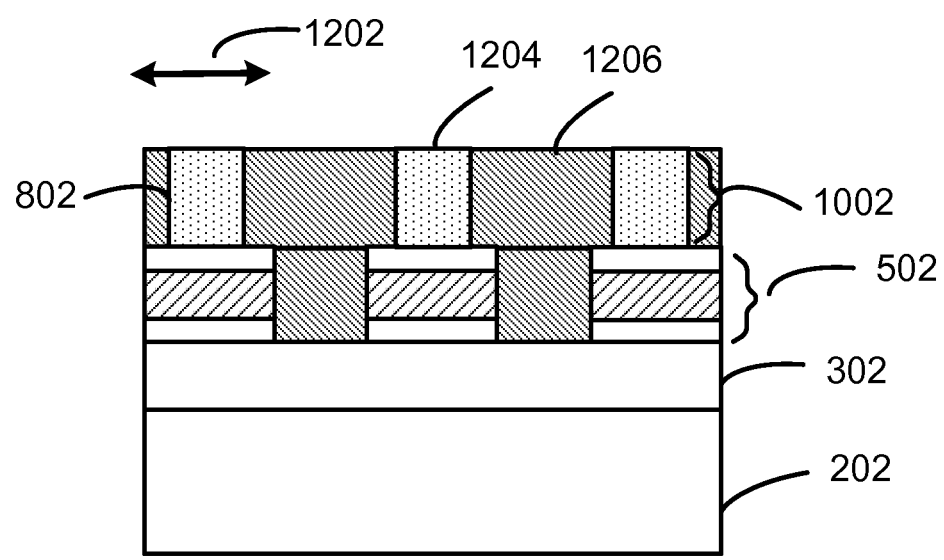
Figure 13:
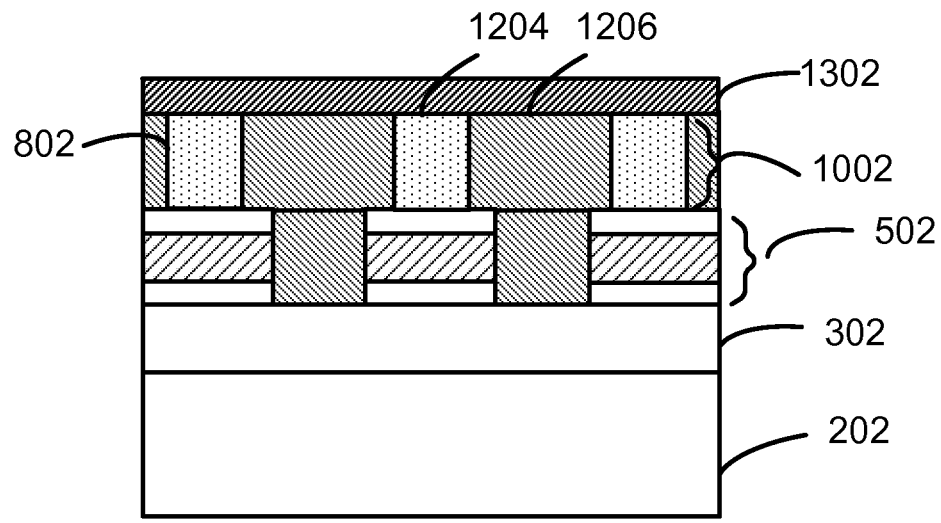

As seen in FIG. 12, in various embodiments, third dielectric material 1102 is then subjected to a planarizing process 1202 to expose a top surface region 1204 of the first structure 1002. Top surface region 1204 includes a top surface region of junction material 802 in a specific embodiment. Depending on the implementation, planarizing process 1202 can remove a portion of junction material 802. In some embodiments, deposition thickness of junction material 802 may have to account for the removal of the top surface region.

In a specific embodiment, the method includes forming a resistive switching material 1302 overlying top surface region of the first structure, including top surface region 1204 of junction material 802 and the exposed surface 1206 of third dielectric material 1102. Depending on the application, the top surface region 1204 of the junction material 802 may be subjecting to a cleaning step to remove contaminants from the planarizing process, and others.

In various embodiments, the resistive switching material 1302 includes an amorphous silicon material having an intrinsic semiconductor characteristic. The amorphous silicon material can be formed using a chemical vapor deposition process such as low pressure chemical vapor deposition process, plasma enhanced chemical vapor deposition process, and others. The chemical vapor deposition process can use silicon precursor such as silane, a suitable chlorosilane in presence of a reducing species (for example, hydrogen), and others. In some embodiments, the deposited amorphous silicon is not intentionally doped to maintain the intrinsic semiconductor characteristic during deposition or after deposition in a specific embodiment. Deposition temperature ranges from about 250 Degree Celsius to about 400 Degree Celsius depending on the implementation.

In other embodiments, as mentioned above, the top surface region 1204 of junction material 802 may be subject to a plasma cleaning/etching process using Argon, oxygen, or the like, for example. In some embodiments, this process may be useful for removing contaminants from the planarization process 1202. In some embodiments, the process also amorphizes an upper region of junction material 802. For example, the process changes a portion of a p+ silicon germanium region to a non-conductive amorphous region, including silicon, p type impurities, germanium, oxygen, and the like. In some examples, a silicon sub-oxide is formed. In some embodiments, this non-conductive amorphized layer may serve as the resistive switching material 1302. In various embodiments, the resistive switching material 1302 may only be formed overlying junction material 802.

Figure 14:
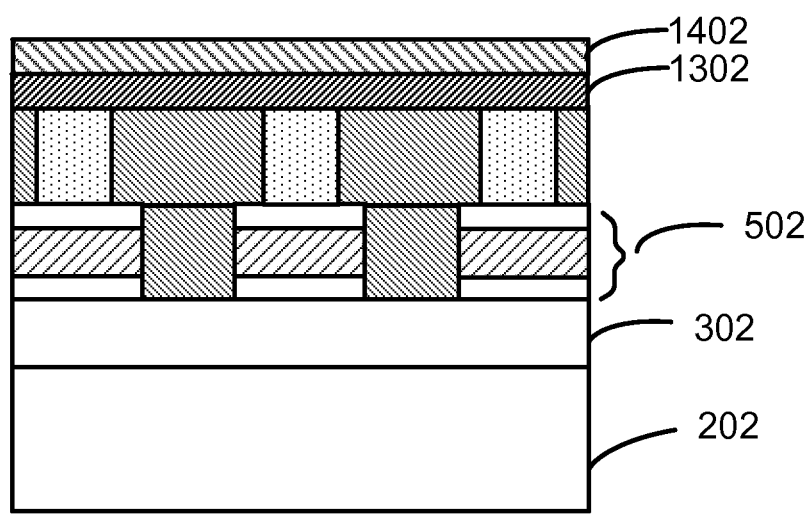

Referring to FIG. 14, the method includes depositing an active metal material 1402 overlying the resistive switching material 1302. In various embodiments, when resistive switching material 1302 is amorphous silicon material, or the amorphized layer formed above, active metal material 1402 can be selected from silver, gold, palladium, platinum, aluminum, chromium, vanadium, and others. In some embodiments, the active metal material is selected to have a desirable diffusivity characteristic in resistive switching material 1302 in a presence of a suitable electric field.

In some embodiments, the active metal material 1402 is silver. Silver is sometimes deposited at a temperature no greater than about 250 Degree Celsius to inhibit mass diffusion of silver into the resistive switching material 1302. In some embodiments, a layer of titanium is deposited above resistive switching material 1302, prior to depositing active metal material 1402. In some embodiments, active metal material 1402 helps to protect resistive switching material 1302 from subsequent processing steps, or other variation.

In a specific embodiment, in operation, when a positive voltage greater than a threshold voltage applied to the active metal material 1402 with respect to the first wiring structure 502 causes the active metal material to migrate into a portion of the resistive switching layer 1302 to cause the material to change from a high resistance state into a low resistance state (or on state) and an on-state current flows.

Figure 15:
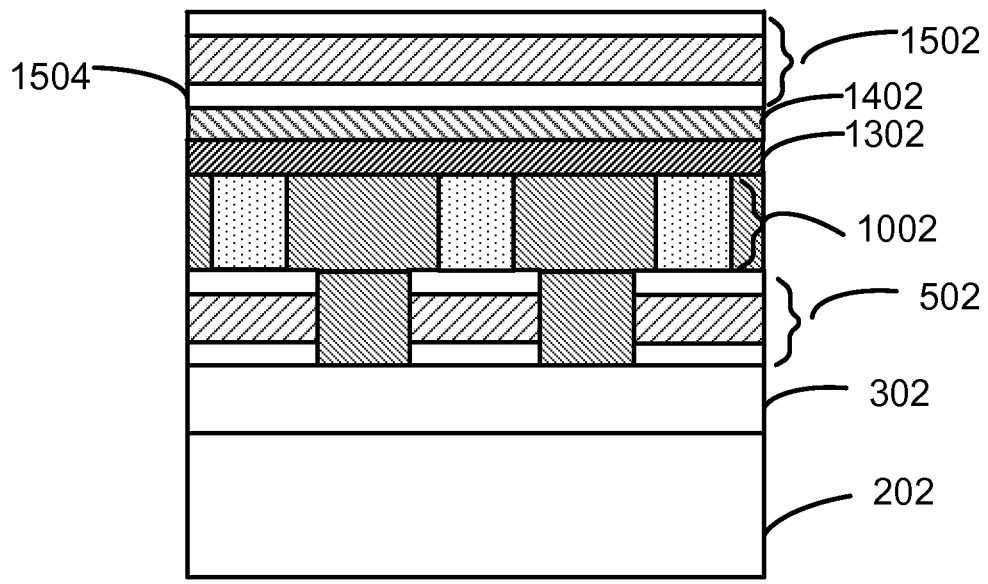
Figure 16:
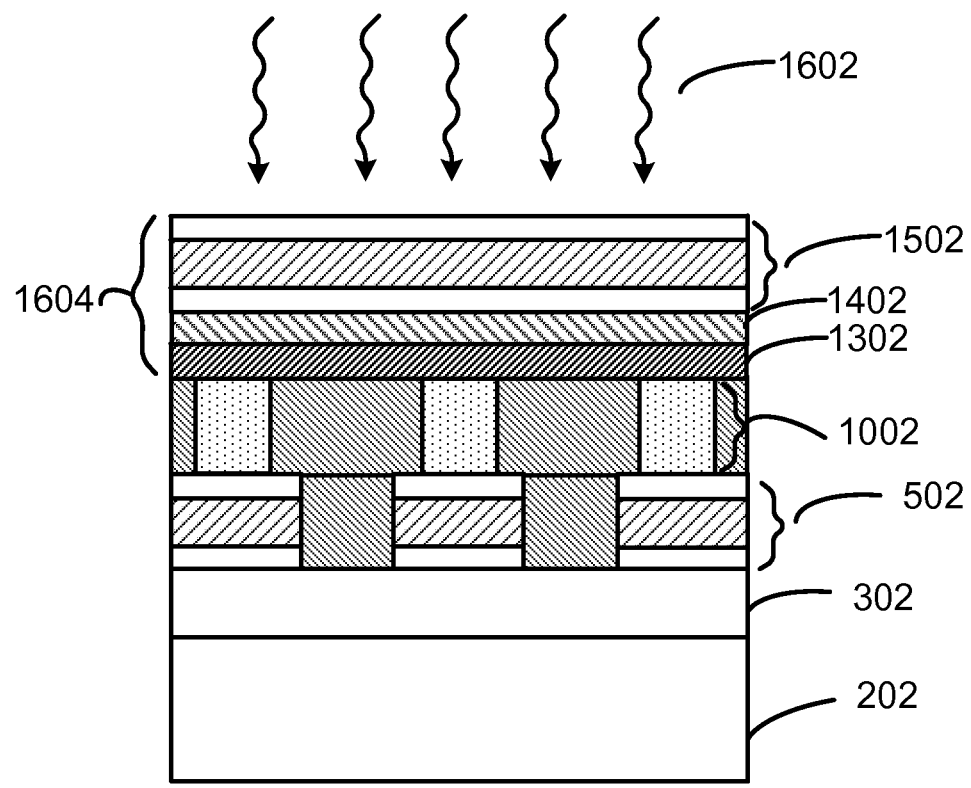

As shown in FIG. 15, the method includes forming a second wiring material 1502 overlying active metal material 1402. Second wiring material 1502 can be copper, tungsten, or aluminum depending on the application. Depending on the implementation, the active metal material 1402 (for example, silver) may also serve as the second wiring material 1502. The second wiring material 1502 can further include one or more diffusion barrier layer material and/or adhesion materials to promote adhesion of the second wiring material 1502 to the second dielectric material 1206 and the active metal material 1402. The one or more diffusion barrier material and/or adhesion materials may further inhibit diffusion of the active metal material 1402 (e.g. silver) to prevent contamination to other parts of the device. Again depending on the implementation, the one or more diffusion barrier and/or adhesion materials can include titanium, titanium nitride, tungsten, titanium tungsten, tungsten, or a combination, and others.

In various embodiments, a diffusion barrier and/or adhesion material layer 1504 may be formed immediately after active metal material 1402 is deposited. This may be done, for example, in situ—within the same chamber, after active metal material 1402 (e.g. silver) is deposited, layer 1504 (e.g. titanium) is then deposited. Such embodiments may be useful to reduce the active metal material 1402 from contaminating subsequent processes, and/or may be useful to reduce undesirable changes to resistive switching material 1302. In some embodiments, this may be combined with a titanium layer (for example) being deposited immediately or close in time after resistive switching material 1302 is formed, and before active metal material 1402 is deposited.

In a specific embodiment, the method subjects a stack of material including the resistive switching material 1302, active metal material 1402, and second wiring material 1502 (including barrier and/or adhesion layers) to a third pattern and etch process 1602 to form a plurality of second structures 1604. Second structures 1604 including resistive switching material 1302, active metal material 1402, and second wiring material 1502 are typically configured to spatially extend in a second direction orthogonal to the first direction in certain embodiments.

In some embodiments wherein resistive switching material 1302 is formed as a result of an amorphizing etch (e.g. argon, oxygen), resistive switching material may be located at the intersections of second structures 1604 and first wiring structures 502.

FIGS. 17-20 illustrate various embodiments of a width of resistive switching material 1302 relative to pillar-like structure 1002, and for with regards to active metal material 1402. Briefly, in FIG. 17, a width of resistive switching material 1302 may be substantially similar to a width of active metal material 1402 and second wiring material 1502; in FIG. 18, a width of resistive switching material 1302 may be between a width of active metal material 1402 and a width of pillar-like structure 1002; in FIG. 19, a width of resistive switching material 1302 and a width of active metal material 1402 may be substantially similar but different from a width of pillar-like structure 1002; and in FIG. 20, a width of resistive switching material 1302 may be substantially similar to a width of pillar-like structure 1002. In light of the present disclosure, one of ordinary skill in the art will recognize that in other embodiments, other combinations and permutation of widths are also taught. In FIGS. 17-20, like references are used in the following and throughout the present disclosure and should not be construed to be limiting.

Figure 17:
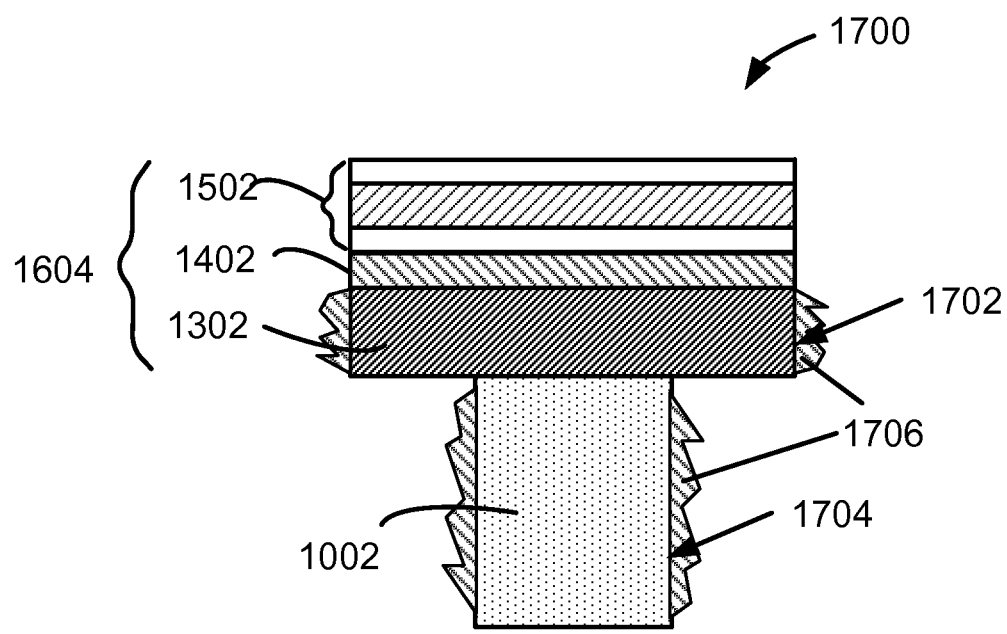
FIGS. 17-19 are simplified diagrams illustrating various partial device structures according to various embodiments of the present invention.

Referring to FIG. 17, a partial view of a resistive switching device 1700 according to various embodiments of the present invention is illustrated. Resistive switching device 1700 can be fabricated according to process steps as illustrated in FIGS. 2-16. As shown, resistive switching device 1700 includes first pillar-like structure 1002 comprising the junction material (for example, p+ polysilicon material; p+ polysilicon germanium material, or p+ SiGe/p-SiGe). First structure includes a first vertical region 1704. Resistive switching device 1700 further includes a second structure 1604. Second structure 1604 includes the resistive switching material 1302, active metal material 1402, and second wiring material configured as a stack of material, as shown. Second structure 1604 includes a common second vertical sidewall region 1702. As shown, first vertical sidewall region 1704 and second vertical sidewall region 1702 are free of a common vertical sidewall or a coincident vertical sidewall region. Contaminants 1706, especially conductive contaminants, on first vertical sidewall region 1704 or second vertical sidewall region 1702 may prevent an appropriate electrical connection between active metal material 1402 and the first wiring structure.

Figure 18:
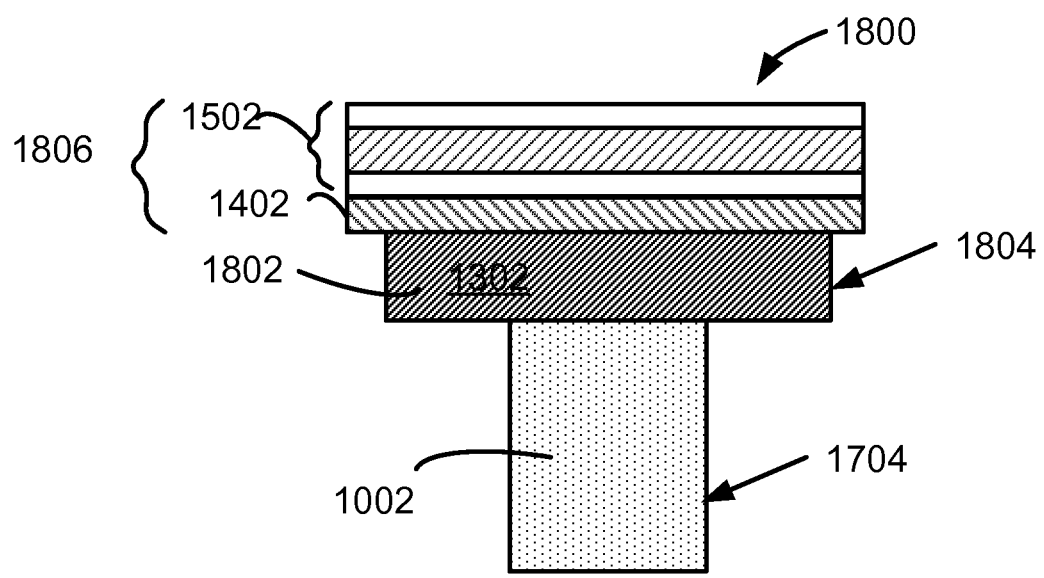

Depending on the implementation, there can be other variations. As shown in FIG. 18, the resistive switching material 1302 can form a resistive switching element 1802 overlying the first structure 1002. Resistive switching element 1802 is configured such that a second vertical side wall region 1804 is free from a common vertical side wall region with the first vertical side wall region 1704 associated with the junction material. Depending on the implementation, resistive switching element 1802 can be configured as a pillar structure having a cross sectional area no less than a cross sectional area of first structure 1704, as illustrated. Alternatively, resistive switching element 1802 can have a cross sectional area no greater than a cross sectional area of the first structure 1002. The method can form a dielectric material overlying resistive switching element 1802 to isolate the resistive switching elements 1802 in a specific embodiment. An active metal material 1402 is deposited overlying resistive switching material 1802 and a wiring material 1302 is deposited overlying the active metal material 1402. The method can form a structure from a second stack of material 1806 including the active metal material 1402 and the second wiring material 1502 in certain embodiments.

Figure 19:
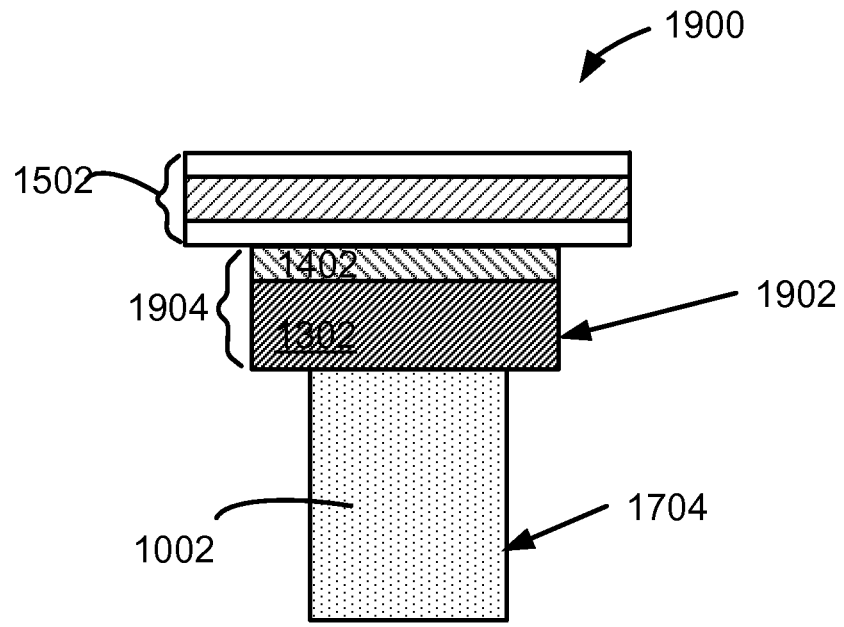

As shown in FIG. 19, the method can from a third structure 1904 including resistive switching material 1302 and active metal material 1402 overlying first structure 1002 associated with the junction material in another implementation. Third structure 1904 can be configured as a pillar structure in certain implementation. Again third structure 1904 is configured such that resistive switching material 1302 and junction material 1002 do not share a common side wall region or a coincident region, as shown in FIG. 19.

In a specific embodiment, a resistive switching device for a non-volatile memory device is provided. The resistive switching device includes a substrate having a surface region. In certain embodiments, the substrate can include one or more transistor device formed thereon. The one or more transistor device provides a circuitry for controlling operations of the resistive switching device. The resistive switching device includes a first dielectric material overlying the substrate and a first wiring structure overlying the first dielectric material. The first wiring structure can include a metal material or a semiconductor material configured to spatially extend in a first direction. The resistive switching device includes a first structure comprising a junction material overlying and in physical and electrical contact with the first wiring structure. In a specific embodiment, the first structure is configured as a pillar structure. The resistive switching device includes a second dielectric material filling the gaps between the first structures and isolate each of the first structures in certain implementation. The resistive switching device includes a second structure overlying the first structure. The second structure includes a stack of materials comprising a resistive switching material, an active metal material, and a second wiring material. In certain implementations, the first structure and the second structure are each elongated in shape and spatially configured perpendicular to each other. The active metal material, the resistive switching material, and the junction material form a resistive switching device in a specific embodiment. In certain implementation, the junction material includes a p+ polycrystalline silicon material. In another implementation, the junction material includes a p+ polycrystalline silicon germanium material. The resistive switching material includes an amorphous silicon material having an intrinsic semiconductor characteristic in a specific embodiment. For amorphous silicon as the resistive switching material, the active metal material can be selected from silver, gold, palladium, nickel, copper, aluminum, and others. The first structure and the second structure are configured such that the junction material and the resistive switching material are free from a common vertical side wall region. Depending on the application, the first wiring material and the second wiring material can each include a metal material and one or more diffusion barrier material. Alternatively, the first wiring material and the second wiring material can each include a doped semiconductor material.

Depending on the implementation, various device structures may be realized. For example, an alternative device structure can have a third structure including the resistive switching material overlying the first structure. The third structure and the first structure are free from a common vertical sidewall region, as shown in FIG. 18.

Yet alternatively, a fourth structure including the resistive switching material and the active metal material may be disposed overlying the first structure, wherein the resistive switching material and the junction material are free from a common sidewall region, as shown in FIG. 19. The second wiring structure is configured in a second direction orthogonal to the first direction of the first wiring structure.

Figure 20:
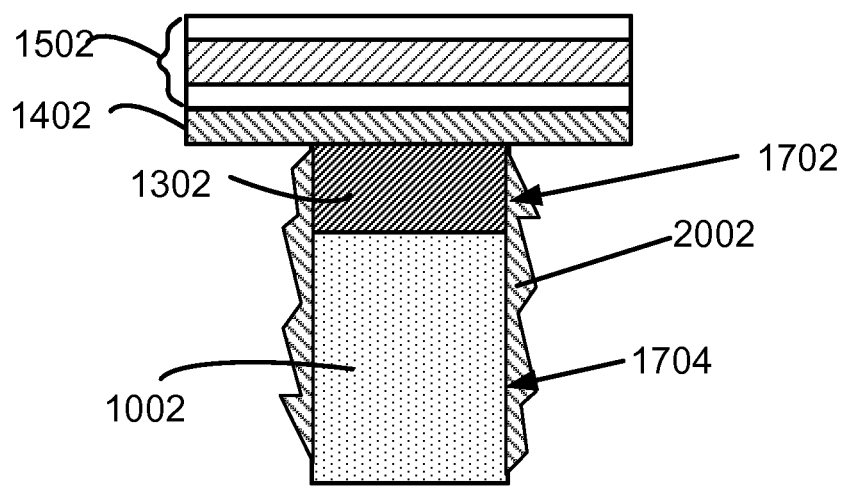
FIG. 20 is a simplified diagram illustrating an example of an undesirable device structure.

FIG. 20 illustrates a resistive switching device where first side wall region 1702 associated with the resistive switching material 1302 shares a common side wall region with second sidewall region 1704 associated with junction material 1002. Contaminant material 2002 would cause electrical connection between second electrode 1402 and first electrodes 502 (not shown) rendering the device defective.

Though the present invention has been exemplified in various embodiments, it is to be understood that the examples and embodiment described herein are for illustrative purpose only and that various modifications or alternatives in light thereof will be suggested to persons skilled in the art and are to be included within the spirit and purview of this application and scope of the appended claims.

What is claimed is:

1. A method for forming a resistive switching device for a non-volatile memory device, comprising:
    providing a substrate having a surface region;
    forming a first dielectric layer overlying the surface region of the substrate;
    forming a first wiring structure comprising a first wiring material overlying the first dielectric layer;
    depositing a first junction material layer comprising a p+ polycrystalline silicon germanium containing material overlying at least the first wiring structure;
    depositing a hardmask material layer overlying the first junction material layer;

subjecting the hardmask material layer and the first junction material layer to a first patterning and etching process to form one or more first structures overlying a surface region of the first wiring structure;
forming a second dielectric layer to fill a gap region between the one or more first structures;
forming a resistive switching material layer overlying the one or more first structures that comprises SiOx;
depositing an active conductive material layer overlying the resistive switching material layer, wherein the resistive switching material layer is at least in part permeable to particles of the active conductive material layer that, in response to an electric field, facilitate formation of a conductive path through the resistive switching material layer;
forming a second structure, overlying a first structure of the one or more first structures, from the resistive switching material layer and the active conductive material layer with one or more second patterning processes,
wherein a first width of any two opposite first vertical sidewalls of the resistive switching material layer in the second structure is greater than a second width of any two opposite second vertical sidewalls of the first structure.

2. The method of claim 1, wherein the first width of the resistive switching material layer in the second structure is substantially equal to a third width of two opposite third vertical sidewalls of the active conductive material layer in the second structure.

3. The method of claim 1, wherein the first width of the resistive switching material layer in the second structure is less than a third width of two opposite third vertical sidewalls of the active conductive material layer in the second structure.

4. The method of claim 3, wherein the resistive switching material layer in the second structure has a first vertical sidewall that is not coplanar with any third vertical sidewalls of the active conductive material layer in the second structure.

5. The method of claim 1, wherein the resistive switching material layer in the second structure has a first vertical sidewall that is not coplanar with any second vertical sidewalls of the first structure.

6. The method of claim 1, further comprising forming a second wiring structure comprising a second wiring material overlying the active conductive material layer;
wherein a third width of two opposite third vertical sidewalls of the active conductive material layer in the second structure is less than a fourth width of two opposite fourth vertical sidewalls of the second wiring structure.

7. The method of claim 1, further comprising depositing a barrier material layer overlying the active conductive material.

8. The method of claim 7, wherein the barrier material layer is adjacent to the active conductive material layer.

9. The method of claim 8, wherein the barrier material layer is selected from a group consisting of: titanium containing material, titanium nitride, titanium tungsten, titanium, tantalum, tantalum nitride, and tungsten nitride.

10. The method of claim 8, wherein the barrier material layer comprises a metal material comprising copper.

11. The method of claim 1, wherein the active conductive material layer is selected from a group consisting of: silver, gold, and aluminum.

12. A method for forming a semiconductor device, comprising:
providing a substrate;
forming a first dielectric layer overlying the substrate;
forming a first wiring structure comprising a first wiring metal overlying the first dielectric layer;
forming a second dielectric layer overlying filling gaps in the surface region of the first wiring structure while leaving a first surface region of the first wiring structure exposed;
forming a structure comprising a junction material layer overlying the first surface region of the first wiring structure;
forming a resistive switching material layer overlying at least a portion of the second dielectric layer and the structure, wherein the resistive switching material comprises a silicon sub-oxide; and
depositing an active conductive material layer overlying the resistive switching material layer, wherein the active conductive material layer is configured to provide particles that form a conductive path through at least a portion of the resistive switching material layer in response to an electric field;
patterning the active conductive material layer and the resistive switching material layer to form a pillar-like memory stack overlying the structure, wherein a first width of any two opposite first vertical sidewalls of the pillar-like memory stack is greater than a second width of any two opposite second vertical sidewalls of the structure; and
forming a second wiring structure comprising a second wiring metal overlying the pillar-like memory stack.

13. The method of claim 12, wherein the active conductive material layer is selected from a group consisting of: silver, gold and aluminum.

14. The method of claim 12, wherein the second wiring metal is selected from a group consisting of: copper, tungsten, and aluminum.

15. The method of claim 14, further comprising depositing a barrier material layer overlying the active conductive material layer, wherein the barrier material layer is selected from a group consisting of: titanium containing material, titanium nitride, titanium tungsten, titanium, tantalum, tantalum nitride, and tungsten nitride.

16. The method of claim 12, wherein the junction material layer comprises a doped polycrystalline silicon germanium material.

17. The method of claim 12,
wherein a third width of two opposite third vertical sidewalls of the resistive switching material layer in the pillar-like memory stack is substantially equal to a fourth width of two opposite fourth vertical sidewalls of the active conductive material layer in the second structure.

18. The method of claim 12,
wherein a third width of two opposite third vertical sidewalls of the resistive switching material layer in the pillar-like memory stack is less than a fourth width of two opposite fourth vertical sidewalls of the active conductive material layer in the second structure.

19. The method of claim 12,
wherein the pillar-like memory stack comprises a resistive switching device; and
wherein the substrate includes one or more MOS devices; and
wherein the one or more MOS devices are selected from a group consisting: processing circuitry, control circuitry for the resistive switching device, and logic circuitry.

20. The method of claim 19, wherein at least one of the one or more MOS devices are coupled to the resistive switching device.

* * * * *